United States Patent [19]
Christianson et al.

[11] 3,946,299
[45] Mar. 23, 1976

[54] BATTERY STATE OF CHARGE GAUGE

[75] Inventors: Clinton C. Christianson, Minnetonka, Minn.; Robert F. Bourke, Wilson, Wis.

[73] Assignee: Gould, Inc., Rolling Meadows, Ill.

[22] Filed: Feb. 11, 1975

[21] Appl. No.: 548,913

[52] U.S. Cl. .................... 320/43; 320/48; 324/29.5
[51] Int. Cl.² .................... H02J 7/00; G01N 27/42
[58] Field of Search ............ 320/43, 44, 45, 48, 21, 320/31; 324/29.5, 76 A

[56] References Cited
UNITED STATES PATENTS

| | | | |
|---|---|---|---|
| 3,676,770 | 7/1972 | Sharaf et al. .................... | 320/48 X |
| 3,778,702 | 12/1973 | Finger .................... | 324/29.5 |
| 3,886,428 | 5/1975 | Macharg .................... | 320/21 X |
| 3,886,442 | 5/1975 | Chiku et al. .................... | 320/48 X |

Primary Examiner—J. D. Miller
Assistant Examiner—Robert J. Hickey
Attorney, Agent, or Firm—Wolfe, Hubbard, Leydig, Voit & Osann, Ltd.

[57] ABSTRACT

A circuit for detecting and indicating the actual state of charge of a storage battery in response to signals sampled from various points in the circuit powered by the battery. Such circuit is adapted to calculate the open circuit voltage of the battery, it being realized that the open circuit voltage is directly proportional to the battery state of charge. A function generator is constructed to simulate the characteristic curve of the battery relating the internal resistance to the percent charge. Feedback is provided from the output of the indicating circuitry to the bias point of the function generator for causing the generator to produce a signal related to the actual internal resistance of the battery. The circuit is adapted to provide a reliable indication of the amount of usable energy remaining in the battery, irrespective of the conditions under which the battery was discharged.

13 Claims, 2 Drawing Figures

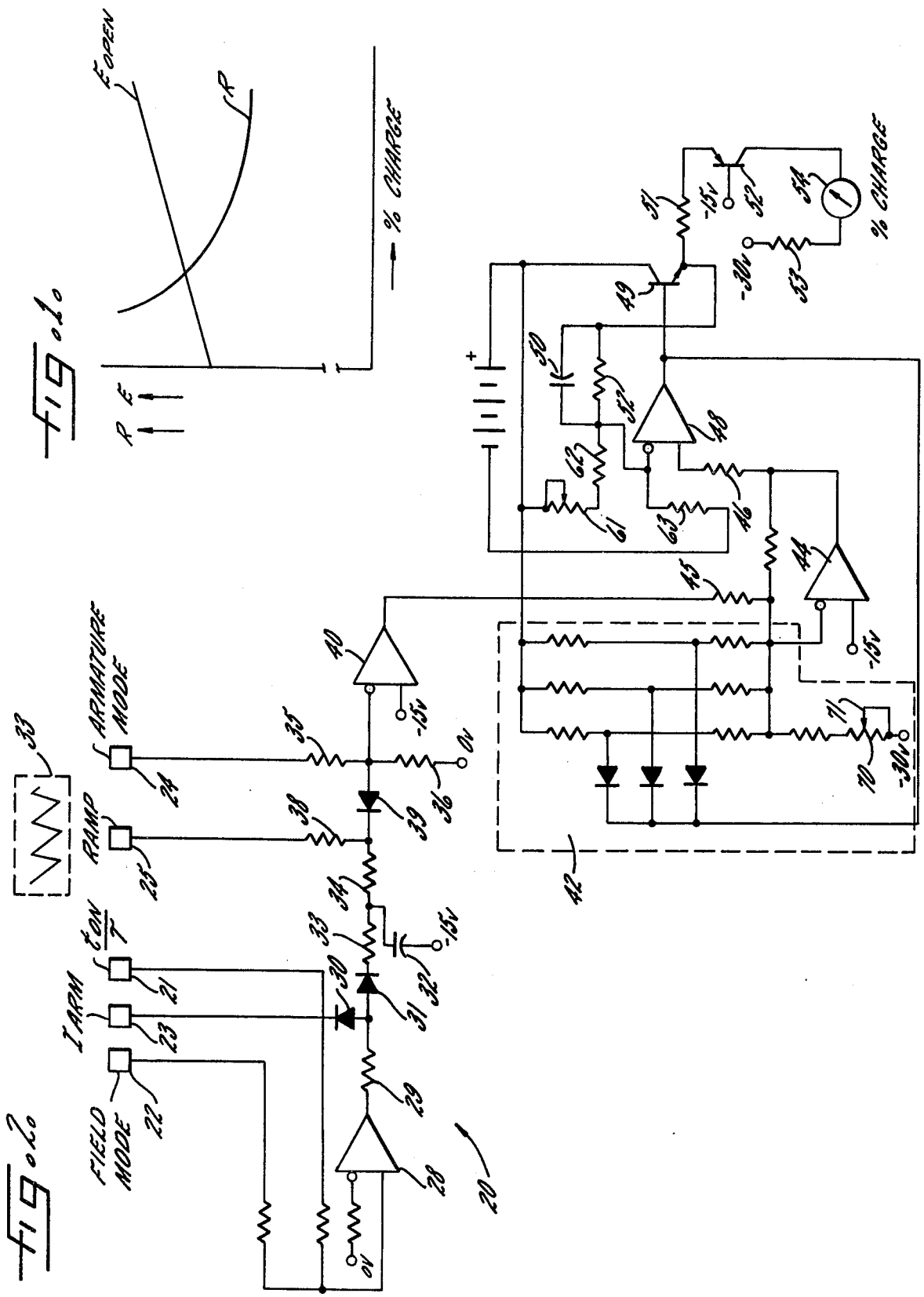

BATTERY STATE OF CHARGE GAUGE

This invention relates to battery powered systems and more particularly to circuits for detecting and indicating the actual state of charge of the battery powering such systems.

In battery powered systems it is desirable to provide some indication of the condition of the battery as a measure of the amount of usable energy remaining and as a guide to the need for a recharge. Systems utilized in battery powered systems known heretofore have not been altogether satisfactory in this regard. One known approach utilizes a coulometer, a device for integrating battery current through a shunt over a relatively long time interval (such as hours or days). In effect, such systems merely indicate the difference between ampere hours into and out of the battery, and as such are incapable of responding to factors such as the rate of discharge which have a definite effect upon the amount of usable energy remaining in a battery. As an alternate indicator, the open circuit voltage of a battery may be measured to provide an excellent indication of the state of charge thereof. However, measuring such voltage to indicate state of charge is impractical for two reasons: (a) battery current must be zero when the voltage is measured, thus preventing the use of this technique during circuit operation and (b) an expanded scale voltmeter is required because of the relatively small change in terminal voltage for a decided change in battery conditions.

With the foregoing in mind, it is a general aim of the present invention to provide a battery state of charge gauge having a different operational mode than those known heretofore adapted to calculate and indicate the actual amount of usable energy remaining in the battery, irrespective of the conditions under which the battery was discharged. In this regard, it is an object of the invention to compute the actual state of charge in response to signals sensed from the circuit being powered by the battery. An objective in accomplishing the foregoing aim is to provide such a circuit which, although inexpensive to manufacture, provides accurate results.

According to a more detailed aspect of the invention, it is an object to provide a circuit for calculating the percent charge of a battery in response to a signal proportional to the battery current, and utilizing a function generator responsive to the circuit result for producing a signal relating to the internal resistance of the battery.

Other objects and advantages will become apparent from the following detailed description, taken in conjunction with the drawings, in which:

FIG. 1 is a graph illustrating the open circuit voltage and internal resistance of a battery as a function of percent charge; and FIG. 2 is a circuit diagram of a battery state of charge gauge exemplifying the present invention.

While the invention will be described in connection with a preferred embodiment, it will be understood that there is no intent to limit it to that embodiment; but, on the contrary, the intent is to cover all alternatives, modifications and equivalents included within the spirit and scope of the invention as defined by the appended claims.

Turning now to the drawings, and particularly to the graph of FIG. 1, it is shown that the open circuit voltage of a battery is directly proportional to the percent charge thereof. Thus, if such open circuit voltage were measured on an expanded scale voltmeter, a precise indication of the percent charge would be provided. This, of course, is impossible when the circuit is providing power.

It is well known, however, that the open circuit voltage of a battery may be calculated if the battery current and internal resistance are known, using the following equation:

$$E_{open} = E_{term} + IR \qquad (1)$$

While the terminal voltage and actual battery current may be determined with relative ease in a given circuit, the internal resistance term is not easily derived. Knowing, however, that both the internal resistance and the open circuit voltage of a battery are determinable functions of the percent charge of the battery, we have found in accordance with the present invention that a circuit can be constructed incorporating these functions and usable with measurable or calculatable factors for deriving the actual percent charge of the battery.

Turning now to FIG. 2, there is shown an exemplary embodiment of a circuit constructed in accordance with the invention. Initially, it should be noted that the embodiment disclosed herein is particularly suitable for use with The Electrically Propelled Vehicle described and claimed in our application Ser. No. 548,911, filed concurrently herewith and assigned to the same assignee as the present invention. Accordingly, portions of the specific circuitry disclosed herein for computing the battery current are complimentary to the circuitry of that vehicle. Accordingly, for illustration herein, corresponding input terminals 21–25 of the battery state of charge gauge have been given designation corresponding with the battery state of charge gauge 260 shown in FIG. 3 of the aforementioned application. It should be recognized, however, that alternate circuit techniques may be used, in keeping with the present invention, to produce a signal proportional to the battery current.

The above referenced patent application discloses a motor control for a d.c. motor operable in a first mode where the armature current is duty cycle controlled and in a second mode where the armature is coupled directly to the battery. In addition to armature current, other major components of battery current present in that system include the motor field current, which in the last mentioned mode becomes negligible, and the current drawn by the control circuit. The circuitry 20 is adapted to sense and sum these currents. To that end, a first input 21 labeled "$t_{on}/T$" is in the form of a square wave indicating the operating duty cycle of the control. This term is used as a multiplier for the average armature crrent when the armature is being duty cycle controlled. A second input 22 labeled "Field Mode" is adapted to negate the input 21 under conditions when the circuit is operating in the field mode, wherein the armature is coupled directly to the battery. A third input 23 labeled "$I_{arm}$" is a signal proportional to the actual armature current flowing in the motor. A fourth sensing input 24 labeled "Armature Mode" is adapted to provide a current of fixed magnitude simulating the field current under conditions when the system is operating in the armature mode. Finally, an input 25 labeled "Ramp" extracts a sawtooth ramp signal from the vehicle controller for use in producing a variable duty cycle signal in the gauge circuitry. Ramp signal generator 33 is shown in dotted form, illustrating that the ramp signal may be provided by a conventional sawtooth generator internal to the gauge circuitry, if desired. In the field mode, the following expression describes the total battery current:

$$I = I_{arm} + I_{control} \qquad (2)$$

wherein field current is considered negligible. By way of contrast, in the armature mode the total battery current may be described as follows:

$$I = I_{arm}(t_{on}T) + I_{control} + I_{field} \qquad (3)$$

The current sensing circuitry 20 is adapted to sense the mode in which the controller is operating and automatically calculate the battery currents. It will be appreciated that in different applications the battery current may be sensed in a different manner. For example, other circuit characteristics might be measured to detect such battery current, or a simple shunt could be placed in series with the battery, if desired.

A first amplifier 28 is provided for modifying the armature current signal received via input 23 in response to the mode of operation. In the field control mode, the measured armature current corresponds to the battery current component due to the armature (100% duty cycle). However, when the armature is being duty cycle controlled, the average armature current must be multiplied by the duty cycle to obtain the average battery current drawn to produce such armature current.

It should be noted here that the amplifiers illustrated in connection with the described embodiment are of the Norton type and are commercially available from National Semiconductor as part No. LM3900N. Such amplifiers are current controlled devices having a pair of inputs for controlling a single ended output. In the illustration, the lower input, which may be regarded as a non-inverting input, serves to drive the output voltage higher in response to increasing current flow into such input. By way of contrast, the upper input, designated with a zero, serves to drive the output lower with increasing current into such input. The Norton amplifiers are further characterized by approximately a one diode drop differential between the inverting and non-inverting inputs due to the internal structure of such amplifiers.

The amplifier 28 has its inverting input supplied from the zero voltage bus, the most positive point in the system, and its non-inverting input summing the signals on inputs 21 and 22. In the field mode of operation the input 22 will be maintained continuously high, thus maintaining the output of amplifier 28 high at all times. By way of contrast, in the armature control mode, the input 22 will be maintained low, thus allowing the amplifier output to respond to the duty cycle signal on input terminal 21. Thus, the output of amplifier 28 will high for the $t_{on}$ portion of each period in the duty cycle. The effect of the output of amplifier 28 going high is to allow current flow through resistor 29 to the junction formed at the anodes of diodes 30 and 31. The voltage at such junction will be controlled by the level of the armature current signal on input 23. Accordingly, the junction voltage will continue to switch at the duty cycle rate between the level of the armature current signal and a negative reference signal. As this occurs, diode 31 will alternate, respectively, between a forward biased and a reversed biased condition. The capacitor 32 is adapted to average the pulses coupled through diode 31 and resistor 33 and therefore the current flowing through resistor 34 will provide a measure of the battery current being drawn due to the armature.

In accordance with the description of the preferred embodiment, it is therefore seen that the circuitry described thus far responds to the mode of operation of the associated controller and charges the capacitor 32 to a voltage which provides a current proportional to the battery current being drawn due to the armature circuit, thereby calculating the first term in equations 2 and 3. That signal is coupled to a summing junction via resistor 34. Additional inputs to the summing junction are from input 24 through a resistor 35, the input 24 being maintained in a low level in the field mode thus negating any input through resistor 35 in such mode. However, in the armature mode a current is provided through resistor 35, the value of the resistor being selected to cause such current to simulate the motor field current. A resistor 36 is coupled between the zero voltage bus and the summing junction to simulate the control current, such current being treated as constant. A resistor 38, coupled to the ramp signal input 25, and a diode 39 are provided for transforming the summed currents into a signal having a duty cycle proportional to the summed currents. Such duty cycle signal will be used in performing a further multiplication.

The particular ramp signal provided to input 25 initiates at a positive level (0 volts) and ramps negatively. Accordingly, when the ramp signal is near zero, the positive voltage on capacitor 32 will maintain diode 39 in the reverse biased condition. The summing resistors 36, and 35 if active, will cause the output of amplifier 40 to be maintained at a low level. As the ramp signal ramps downward, a point will be reached when the capacitor charge will be negated and the diode 39 will be forward biased drawing further current from the junction between resistors 36 and 35. Ultimately, the ramp signal will reach a point where the output of amplifier 40 will shift to a high level. It will be appreciated that the larger the summed currents from resistors 34, 35 and 36, the longer it will take for the output of amplifier 40 to switch positively. Accordingly, the output of amplifier 40 comprises a train of pulses at the frequency of the ramp pulse generator and having a duty cycle proportional to the summed currents.

For producing a signal simulating the internal resistance of the battery, a function generator generally indicated at 42 is provided. Such function generator includes an arrangement of resistors and diodes, the resistor value and the position of the biasing junction being so related to approximate the curve R of FIG. 1 by means of linear piecewise approximation. Additionally, resistors 70 and 71 add a fixed current proportional to internal resistance of the battery at 100% charge. Such function generators are well known to those skilled in the art and will not be described further herein. It is seen that the function generator provides a first input to the summing junction at the inverting input of amplifier 44. The second input is provided by amplifier 40 via resistor 45. It is recalled that the output of amplifier 40 is a variable duty cycle signal having a duty cycle proportional to the summed currents. When such duty cycle signal is at a high level (the off state of the duty cycle) the current through resistor 45 controls over the current provided by the function generator and drives the output of amplifier 44 low. However, when the output of amplifier 40 is low, the function generator is gated on, thereby causing the output of amplifier 44 to follow the signal provided by the function generator. If the biasing point 72 formed at the commoned cathodes of the diodes in the function generator is biased with a signal related to the state of charge of the battery, the output current of the function generator, at the summing junction of amplifier 44, will be an accurate indication of the internal resistance of the battery. Since the signal relating to the internal resistance is gated on and off at the duty cycle determined by the summed currents, the output of amplifier 44, if averaged, will be proportional to the product of the current and resistance i.e. the I R drop within the battery. To that end, the output of amplifier 44 is coupled through resistor 46 to the non-inverting input of amplifier 48. The amplifier 48 has a negative feedback path including the base emitter junction of an emitter follower transistor 49 and an integrating capacitor 50. Accordingly, the amplifier 48 will be caused to integrate the signal applied to its input, via resistor 46, causing its output to average the pulsed signal, thereby providing the necessary product. It is seen that the battery is coupled via resistor 63 to the inverting input of amplifier 48. This arrangement causes the amplifier 48 to add a current proportional to the terminal voltage of the battery to the aforementioned current proportional to the I R drop within the battery. Additionally, resistors 61 and 62 coupled between the positive terminal of the battery and the summing junction subtract a current proportional to the open circuit voltage of the battery at 0% charge thereby achieving the effect of an expanded scale voltmeter. Amplifier 48 responds to these currents to produce an output signal which is an accurate measure of the usable energy within the battery. It will be appreciated that the feedback path from amplifier 48 to the common cathodes of the function generator 42 causes the function generator to produce the proper resistance signal because such output is directly related to the battery state of charge. The emitter follower 49 provides current gain. The voltage across the resistor 51 is equal to the voltage across feedback resistor 52 and thus the current through resistor 51 is proportional to the state of charge of the battery. In addition, the current in the collector of transistor 55 will be a close approximation of the current in resistor 51. A properly calibrated meter 54 is connected to respond to that current. The meter face may be calibrated to read percent charge directly, thus providing a visual indication of the actual amount of usable energy remaining in the battery.

What is claimed is:

1. Circuitry for measuring the usable energy present in an electric battery comprising, in combination, means for producing a first signal proportional to battery current, means responsive to a feedback signal for generating a second signal simulating the internal resistance of the battery, means for muliplying said first and second signals to produce a product signal, means for adding a signal related to the battery terminal voltage to said product signal thereby to produce an output signal, said output signal being coupled to said generating means to serve as said feedback signal, whereby the level of said output signal is a measure of the state of charge of the battery.

2. A state of charge measuring circuit for use with an electrical battery comprising in combination, means for producing a first signal proportional to current flow from the battery, means for generating a second signal proportional to the internal resistance of the battery at its actual state of charge, means for multiplying said first and second signals to produce a product signal, means for producing a third signal proportional to the loaded terminal voltage of the battery, means for adding the third signal to the product signal to produce a sum signal, means for producing a fourth signal proportional to the open circuit voltage of the battery at 0% charge, means for subtracting the fourth signal from the sum signal thereby to produce an output signal proportional to the actual state of charge of the battery.

3. The battery state of charge measuring circuit as set forth in claim 2 wherein the generating means includes feedback signal means coupled to said output thereby to relate said second signal to the actual state of charge of the battery.

4. The battery state of charge measuring circuit as set forth in claim 2 wherein the generating means comprises a function generator having a biasing input for controlling the magnitude of said second signal, and means coupling the output signal to said biasing means for feeding back the signal proportional to the state of charge of the battery thereby to relate the resistance signal to the actual state of charge of the battery.

5. The battery state of charge measuring circuit as set forth in claim 4 wherein the function generator comprises a linear piecewise approximation generator.

6. The battery state of charge measuring circuit as set forth in claim 2 further including indicator means driven by said output signal for showing the state of charge of the battery.

7. The battery state of charge measuring circuit as set forth in claim 2 wherein the means for producing the first signal comprises amplifier means responsive to the battery current and to a ramp signal for producing an output having a duty cycle proportional to the battery current.

8. The battery state of charge measuring circuit as set forth in claim 2 wherein the first signal has a duty cycle proportional to the battery current, said multiplying means comprising means for gating the second signal on and off in dependence on the duty cycle of said first signal and means for integrating the gated signal thereby to produce the product of said signals.

9. The battery state of charge measuring circuit as set forth in claim 2 including circuit means drawing current from said battery, wherein said means for producing a first signal comprises amplifier means coupled to said circuit means for responding to signals in said circuit means to indirectly compute said signal proportional to current flow.

10. The battery state of charge measuring circuit as set forth in claim 2 including circuit means drawing current from said battery, said circuit means producing a plurality of signals indicative of individual current components drawn by said circuit means, said means for producing a first signal comprising amplifier means responsive to the plurality of signals for computing the total current drawn by said circuit means.

11. A battery state of charge gauge for use with a battery comprising in combination, means for generating a first signal proportional to the current drawn from the battery, means for producing a ramp signal, means for combining said first signal and said ramp signal for producing a second signal having a duty cycle proportional to the current drawn from the battery, function generator means for approximating a characteristic curve relating the internal resistance of the battery to its state of charge, biasing means coupled to the function generating means for causing said function generator to produce a third signal proportional to the internal resistance of the battery at its actual state of charge, means combining the duty cycle signal and the third signal for producing the product thereof, means for generating a fourth signal proportional to the actual terminal voltage of the battery, and means for adding said third and fourth signals, thereby to produce an output signal proportional to the actual state of charge of the battery.

12. The battery state of charge gauge as set forth in claim 11 wherein the biasing means comprises a feedback connection coupling the output signal to the function generating means.

13. The battery state of charge gauge as set forth in claim 11 wherein the combining means comprises means for gating said third signal on and off in dependence upon the duty cycle of said second signal to produce a gated signal, and means for integrating the gated signal.

* * * * *